United States Patent
Reznicek et al.

(10) Patent No.: US 10,559,692 B2
(45) Date of Patent: Feb. 11, 2020

(54) NANOSHEET SUBSTRATE ISOLATION SCHEME BY LATTICE MATCHED WIDE BANDGAP SEMICONDUCTOR

(71) Applicant: International Business Machines Corporation, Armonk, NY (US)

(72) Inventors: Alexander Reznicek, Troy, NY (US); Xin Miao, Slingerlands, NY (US); Jingyun Zhang, Albany, NY (US); Choonghyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/560,607

(22) Filed: Sep. 4, 2019

(65) Prior Publication Data
US 2020/0006569 A1 Jan. 2, 2020

Related U.S. Application Data (62) Division of application No. 15/973,043, filed on May 7, 2018.

(51) Int. Cl.
| | |
|---|---|
| *H01L 29/786* | (2006.01) |
| *H01L 21/8238* | (2006.01) |
| *H01L 27/092* | (2006.01) |
| *H01L 21/02* | (2006.01) |
| *H01L 29/423* | (2006.01) |
| *H01L 29/06* | (2006.01) |

(Continued)

(52) U.S. Cl.
CPC .. *H01L 29/78609* (2013.01); *H01L 21/02532* (2013.01); *H01L 21/02603* (2013.01); *H01L 21/76297* (2013.01); *H01L 21/823807* (2013.01); *H01L 21/823814* (2013.01); *H01L 21/823828* (2013.01); *H01L 21/823878* (2013.01); *H01L 27/092* (2013.01); *H01L 29/0649* (2013.01); *H01L 29/0673* (2013.01); *H01L 29/42392* (2013.01); *H01L 29/66545* (2013.01); *H01L 29/78618* (2013.01); *H01L 29/78651* (2013.01); *H01L 29/78696* (2013.01)

(58) Field of Classification Search
USPC .......................................................... 257/351
See application file for complete search history.

(56) References Cited

U.S. PATENT DOCUMENTS

| | | |
|---|---|---|
| 5,187,110 A | 2/1993 | Aina et al. |
| 9,461,114 B2 | 10/2016 | Obradovic et al. |
| 9,484,267 B1 | 11/2016 | Cheng et al. |

(Continued)

OTHER PUBLICATIONS

List of IBM Patents or Patent Applications Treated as Related dated Sep. 4, 2019, 2 pages.

*Primary Examiner* — Nilufa Rahim
(74) *Attorney, Agent, or Firm* — Scully, Scott, Murphy & Presser, P.C.; L. Jeffrey Kelly, Esq.

(57) ABSTRACT

A thin layer of lattice matched wide bandgap semiconductor material having semi-insulating properties is employed as an isolation layer between the substrate and a vertical stack of suspended semiconductor channel material nanosheets. The presence of such an isolation layer eliminates the parasitic leakage path between the source region and the drain region that typically occurs through the substrate, while not interfering with the CMOS device that is formed around the semiconductor channel material nanosheets.

18 Claims, 7 Drawing Sheets

(51) Int. Cl.
*H01L 21/762* (2006.01)
*H01L 29/66* (2006.01)

(56) References Cited

U.S. PATENT DOCUMENTS

| | | |
|---|---|---|
| 9,653,537 B1 | 5/2017 | Jagannathan et al. |
| 2014/0113402 A1 | 4/2014 | Bedell et al. |
| 2014/0151639 A1 | 6/2014 | Chang et al. |
| 2015/0035071 A1 | 2/2015 | Ching et al. |
| 2015/0372097 A1 | 12/2015 | Bao et al. |
| 2016/0197154 A1 | 7/2016 | Basu et al. |
| 2016/0204253 A1* | 7/2016 | Basu ................ H01L 29/7842 257/190 |
| 2016/0225768 A1 | 8/2016 | Cheng et al. |
| 2017/0256610 A1 | 9/2017 | Guillorn et al. |
| 2018/0108733 A1 | 4/2018 | Augendre et al. |
| 2018/0301564 A1* | 10/2018 | Kwon ............... H01L 29/78618 |

\* cited by examiner

NANOSHEET SUBSTRATE ISOLATION SCHEME BY LATTICE MATCHED WIDE BANDGAP SEMICONDUCTOR

BACKGROUND

The present application relates to a semiconductor structure and a method of forming the same. More particularly, the present application relates to a semiconductor structure containing an isolation layer composed of a lattice matched wide bandgap semiconductor material that is present between a substrate and a vertical stack of suspended semiconductor channel material nanosheets.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material relative to another semiconductor material to form suspended nanosheets for gate-all-around devices. In the current state of the art, the gate wrapping the bottommost semiconductor channel material nanosheet of a vertical stack of suspended semiconductor channel material nanosheets contacts the semiconductor substrate which leads to potential parasitic leakage paths between the source region and the drain region through the semiconductor substrate. There is a need for providing nanosheet isolation for controlling the off-state leakage current, without interfering with the nanosheet CMOS device.

SUMMARY

A thin layer of lattice matched wide bandgap semiconductor material having semi-insulating properties is employed as an isolation layer between the substrate and a vertical stack of suspended semiconductor channel material nanosheets. The presence of such an isolation layer eliminates the parasitic leakage path between the source region and the drain region that typically occurs through the substrate, while not interfering with the CMOS device that is formed around the semiconductor channel material nanosheets.

One aspect of the present application relates to a semiconductor structure. In one embodiment, the semiconductor structure includes a plurality of stacked and suspended semiconductor channel material nanosheets located above an isolation layer that is present on a substrate. In accordance with the present application, the substrate is composed of a first semiconductor material having a first bandgap, and the isolation layer is composed of a second semiconductor material having a second bandgap that is larger than the first bandgap, wherein the second semiconductor material is lattice matched to the first semiconductor material and is doped such that the second semiconductor material has semi-insulating properties. A functional gate structure surrounds a portion of each semiconductor channel material nanosheet of the plurality of stacked and suspended semiconductor channel material nanosheets. A source/drain (S/D) region is present on each side of the functional gate structure and physically contacts sidewalls of each semiconductor channel material nanosheet of the plurality of stacked and suspended semiconductor channel material nanosheets.

In another embodiment of the present application, the semiconductor structure includes an nFET device region including a plurality of first stacked and suspended semiconductor channel material nanosheets located above a first isolation layer that is present on a substrate, wherein the substrate is composed of a first semiconductor material having a first bandgap, and the first isolation layer is composed of a second semiconductor material having a second bandgap that is larger than the first bandgap, wherein the second semiconductor material is lattice matched to the first semiconductor material and contains a p-type dopant, a first functional gate structure surrounds a portion of each semiconductor channel material nanosheet of the plurality of first stacked and suspended semiconductor channel material nanosheets, and a source/drain (S/D) region is located on each side of the first functional gate structure and physically contacts sidewalls of each semiconductor channel material nanosheet of the plurality of first stacked and suspended semiconductor channel material nanosheets.

In this embodiment, the semiconductor structure further includes a pFET device region laterally adjacent to the nFET device region, the pFET device region includes a plurality of second stacked and suspended semiconductor channel material nanosheets located above a second isolation layer that is present on the substrate, wherein the second isolation layer is composed of another second semiconductor material having a second bandgap that is larger than the first bandgap, wherein the another second semiconductor material is lattice matched to the first semiconductor material and contains an n-type dopant, a second functional gate structure surrounds a portion of each semiconductor channel material nanosheet of the plurality of second stacked and suspended semiconductor channel material nanosheets, and a source/drain (S/D) region is located on each side of the second functional gate structure and physically contacts sidewalls of each semiconductor channel material nanosheet of the plurality of second stacked and suspended semiconductor channel material nanosheets.

Another aspect of the present application relates to a method of forming a semiconductor structure. In one embodiment, the method includes forming a nanosheet stack of alternating nanosheets of a sacrificial semiconductor material nanosheet and a semiconductor channel material nanosheet on an isolation layer that is disposed on a substrate, wherein a sacrificial gate structure and a dielectric spacer material layer straddle over the nanosheet stack. The substrate that is employed is composed of a first semiconductor material having a first bandgap, and the isolation layer is composed of a second semiconductor material having a second bandgap that is larger than the first bandgap, and further wherein the second semiconductor material is lattice matched to the first semiconductor material and is doped such that the second semiconductor material has semi-insulating properties. Next, end portions of each of the sacrificial semiconductor material nanosheets are recessed to provide a gap between each of the semiconductor channel material nanosheets, and, thereafter, an inner spacer is formed in each gap. A source/drain (S/D) region is then formed by epitaxial growth of a semiconductor material on physically exposed sidewalls of each semiconductor channel material nanosheet. Next, the sacrificial gate structure and each recessed sacrificial semiconductor material nanosheet are removed, and, thereafter, a functional gate structure is formed around exposed surfaces of each semiconductor channel material nanosheet.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
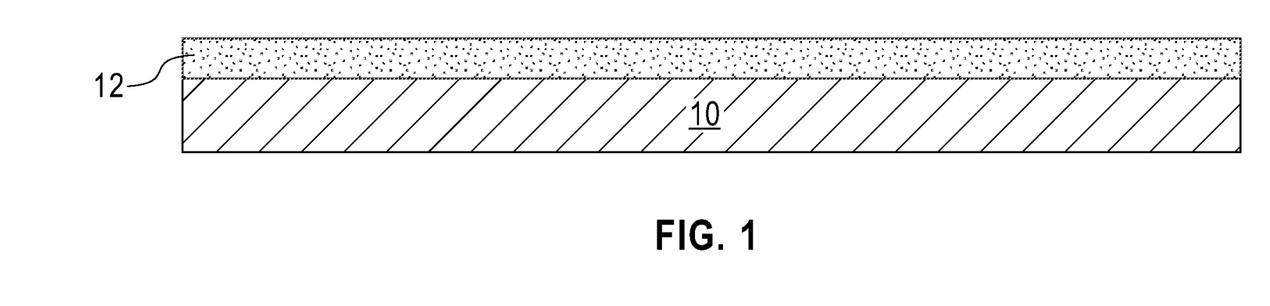
FIG. 1 is a cross sectional view of an exemplary semiconductor structure of the present application during an early stage of fabrication and including an isolation layer located on a surface of a substrate, wherein the substrate is composed of a first semiconductor material having a first bandgap, and the isolation layer is composed of a second semiconductor material having a second bandgap that is larger than the first bandgap, wherein the second semiconductor material is lattice matched to the first semiconductor material and is doped such that the second semiconductor material has semi-insulating properties.

Referring first to FIG. 1, there is illustrated an exemplary semiconductor structure of the present application during an early stage of fabrication and including an isolation layer 12 located on a surface of a substrate 10. The isolation layer 12 typically has a thickness from 3 nm to 20 nm.

In the present application, the substrate 10 is composed of a first semiconductor material having a first bandgap, while the isolation layer 12 is composed of a second semiconductor material having a second bandgap that is larger than the first bandgap. Also, the second semiconductor material that provides the isolation layer 12 is lattice matched to the first semiconductor material and is doped such that the second semiconductor material has semi-insulating properties.

In one example, isolation layer 12 may be composed of GaP (lattice constant 5.451 Å), while the substrate 10 is composed of Si (lattice constant 5.431 Å). In one embodiment, the GaP may be doped with chromium (Cr; Cr doping concentration can be from 1E15 atoms/cm$^3$ to 1E18 atoms/cm$^3$); the GaP that is doped with Cr has a resistivity that is greater than 1E8 ohm*cm. In another embodiment, and when nFET and pFET devices are formed, the nFET region can include an isolation layer composed of GaP doped with Zn (Zn; Zn doping concentration can be from 1E17 atoms/cm$^3$ to 1E20 atoms/cm$^3$), while the pFET region may include GaP doped with tin (Sn; Sn doping concentration can be from 1E17 atoms/cm$^3$ to 1E20 atoms/cm$^3$). It should be noted that other p-type dopants can be used with the GaP layer in the nFET device region, while other n-type dopants can be used in the pFET device region.

In another example, isolation layer 12 may be composed of InP, while substrate 10 is composed of InGaAs. In one embodiment, the InP may be doped with iron (Fe; Fe doping concentration is typically about 5E18 atoms/cm$^3$).

In one embodiment, the isolation layer 12 can be epitaxially grown on the substrate 10; the dopant is typically introduced in-situ during the epitaxial growth process itself. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface.

Therefore, an epitaxial semiconductor material has the same crystalline characteristics as the deposition surface on which it is formed. The isolation layer 12 thus has an epitaxial relationship with the substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the isolation layer 12 can be performed utilizing well known precursor gas or precursor gas mixture. Carrier gases like hydrogen, nitrogen, helium and argon can also be used.

Figure 2:
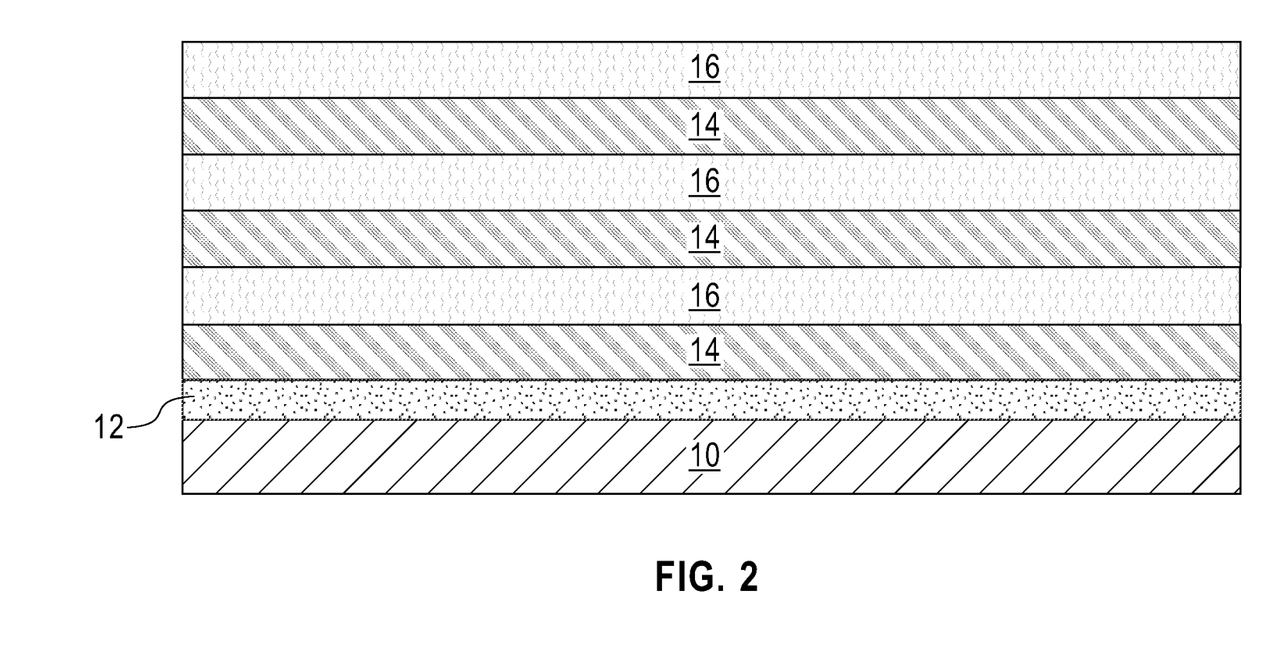
FIG. 2 is a cross sectional view of the exemplary semiconductor structure of FIG. 1 after forming a fin structure comprising a vertical stack of alternating layers of a sacrificial semiconductor material layer and a semiconductor channel material layer on a surface of the isolation layer.

Referring now to FIG. 2, there is illustrated the exemplary semiconductor structure of FIG. 1 after forming a fin structure comprising a vertical stack of alternating layers of a sacrificial semiconductor material layer 14 and a semiconductor channel material layer 16 on a surface of the isolation layer 12. Although a single fin structure is described and illustrated, a plurality of fin structures each containing a vertical stack of alternating layers of a sacrificial semiconductor material layer 14 and a semiconductor channel material layer 16 can be formed. In such an embodiment, each fin structure is orientated parallel to one another.

The formation of the fin structure includes forming a semiconductor material stack upon the isolation layer 12 and then patterning the semiconductor material stack to form the fin structure. Patterning may be performed by lithography and etching or any other patterning method known to those skilled in the art including, for example, a sidewall-image transfer (SIT) process.

The term "fin structure" denotes a continuous structure including a pair of vertical sidewalls that are parallel to each other. As used herein, a surface is "vertical" if there exists a vertical plane from which the surface does not deviate by more than three times the root mean square roughness of the surface. The fin structure may have a height from 10 nm to 100 nm, a width from 4 nm to 30 nm, and a length from 100 nm to 2000 nm. Other heights and/or widths and/or lengths may also be used as the dimensions of fin structure.

The semiconductor material stack (14/16) that is employed in forming the fin structure is composed of alternating layers of the sacrificial semiconductor material layer 14 and the semiconductor channel material layer 16 which alternate one atop the other; the alternating layers of the sacrificial semiconductor material layer 14 and the semiconductor channel material layer 16 are also present in the fin structure In one example, the semiconductor material stack includes three sacrificial semiconductor material layers 14 and three semiconductor channel material layers 16. The semiconductor material stack that can be employed in the present application is not limited to such a semiconductor material stack. Instead, the semiconductor material stack can include any number of sacrificial material layers and corresponding semiconductor channel material layers.

Each sacrificial semiconductor material layer 14 is composed of a third semiconductor material which differs in composition from the second semiconductor material that provides isolation layer 12. In one embodiment, each sacrificial semiconductor material layer 14 is composed of a silicon germanium alloy. The third semiconductor material that provides each sacrificial semiconductor material layer 14 can be formed utilizing an epitaxial growth (or deposition process) as defined above.

Each semiconductor channel material layer 16 is composed of a fourth semiconductor material that has a different etch rate than the third semiconductor material that provides the sacrificial semiconductor material layers 14. In one example, each semiconductor channel material layer 16 is composed of Si or a III-V compound semiconductor, while each sacrificial semiconductor material layer 14 is composed of a silicon germanium alloy. The fourth semiconductor material that provides each semiconductor channel material layer 16 can be formed utilizing an epitaxial growth (or deposition process) as defined above.

The semiconductor material stack can be formed by sequential epitaxial growth of alternating layers of the third semiconductor material and the fourth semiconductor material.

The sacrificial semiconductor material layers 14 may have a thickness from 5 nm to 12 nm, while the semiconductor channel material layers 16 may have a thickness from 5 nm to 12 nm. Each sacrificial semiconductor material layer 14 may have a thickness that is the same as, or different from, a thickness of each semiconductor channel material layer 16.

Figure 3:
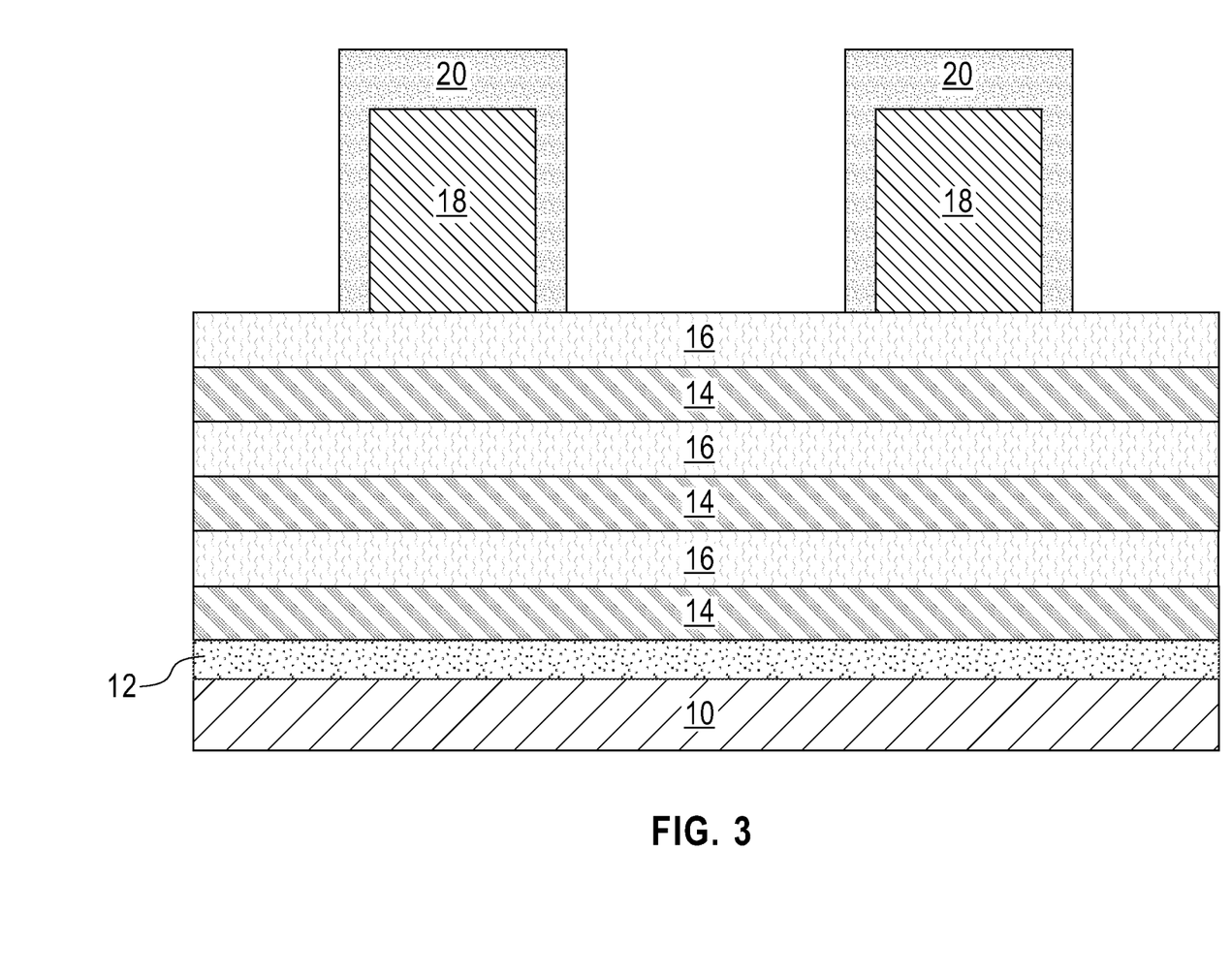
FIG. 3 is a cross sectional view of the exemplary semiconductor structure of FIG. 2 after forming a sacrificial gate structure and a dielectric spacer material layer on a surface of the fin stack.

Referring now to FIG. 3, there is illustrated the exemplary semiconductor structure of FIG. 2 after forming a sacrificial gate structure 18 and a dielectric spacer material layer 20 on a surface of the fin structure (14,16). In the illustrated embodiment, two sacrificial gate structures 18 are shown by way of one example. The present application is not limited to forming two sacrificial gate structures 18, but instead contemplates embodiments in which a single sacrificial gate structure or three or more sacrificial gate structures are formed on the fin structure.

Each sacrificial gate structure 18 that is formed is located on a first side and a second side of the fin structure (not shown), and spans across a topmost surface of a portion of the fin structure. Each sacrificial gate stack 18 thus straddles over a portion of the fin structure. A dielectric spacer material layer 20 is present on the exposed surfaces of each sacrificial gate structure 18.

Each sacrificial gate structure 18 may include a single sacrificial material or a stack of two or more sacrificial materials (i.e., each sacrificial gate structure 18 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide each sacrificial gate structure 18.

The dielectric spacer material layer 20 can be formed by deposition of a dielectric spacer material and then etching the dielectric spacer material. One example of a dielectric spacer material that may be employed in the present application is silicon nitride. The deposition process that can be employed in providing the dielectric spacer material includes, for example, chemical vapor deposition (CVD), plasma enhanced chemical vapor deposition (PECVD), or physical vapor deposition (PVD). The etch used to etch the deposited dielectric spacer material may comprise a dry etching process such as, for example, reactive ion etching.

Figure 4:
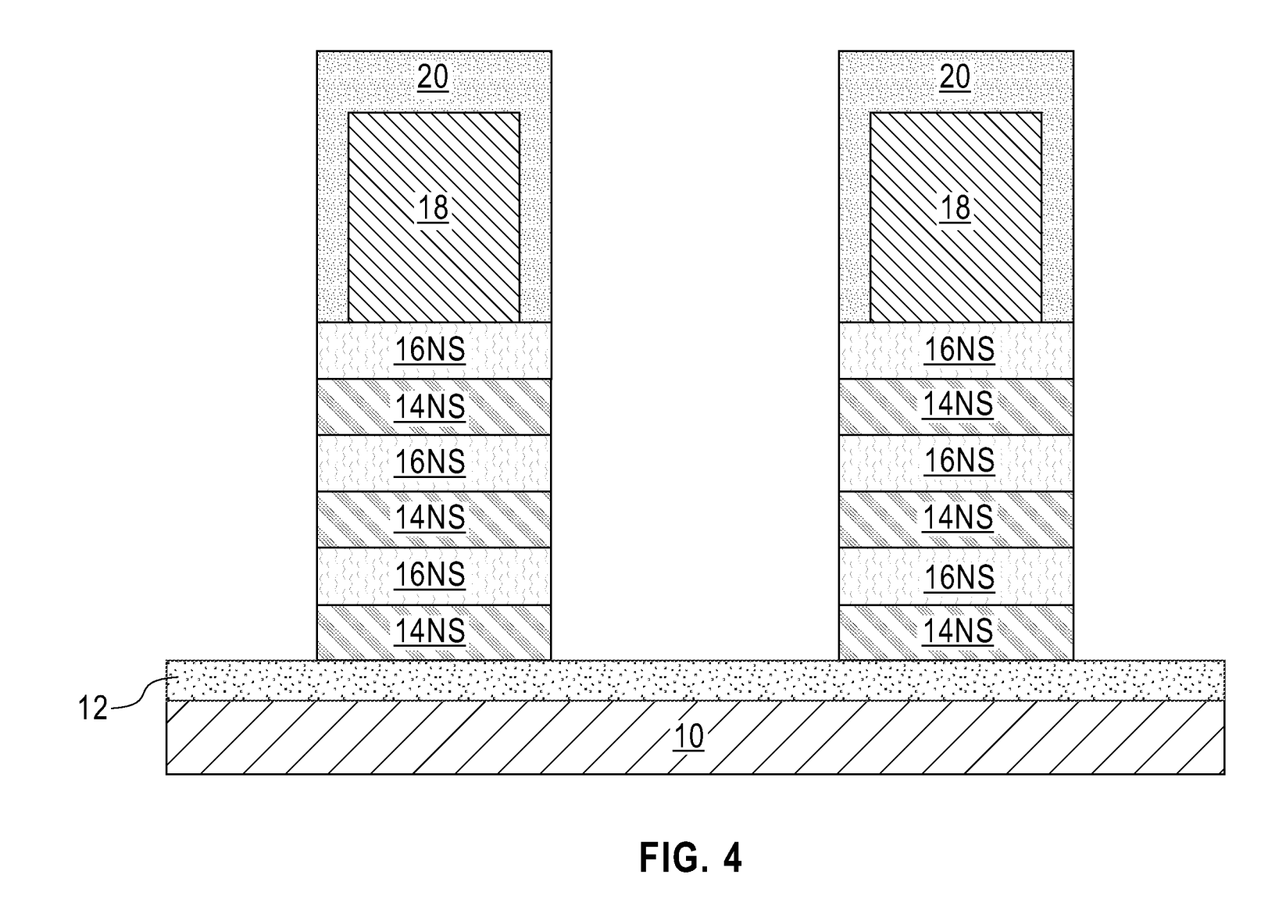
FIG. 4 is a cross sectional view of the exemplary semiconductor structure of FIG. 3 after forming a nanosheet stack of alternating nanosheets of a sacrificial semiconductor material nanosheet and a semiconductor channel material nanosheet under the sacrificial gate structure and the dielectric spacer material layer by removing physically exposed portions of the fin stack that are not protected by sacrificial gate structure and the dielectric spacer material layer.

Referring now FIG. 4, there is illustrated the exemplary semiconductor structure of FIG. 3 after forming a nanosheet stack of alternating nanosheets of a sacrificial semiconductor material nanosheet 14NS and a semiconductor channel material nanosheet 16NS under the sacrificial gate structure 18 and the dielectric spacer material layer 20 by removing physically exposed portions of the fin structure that are not protected by sacrificial gate structure 18 and the dielectric spacer material layer 20. The removal of the physically portions of the fin structure not covered by the sacrificial gate structure 18 and the dielectric spacer material layer 20 can be performed utilizing an anisotropic etching process such as, for example, reactive ion etching (RIE). Portions of the fin structure remain beneath the sacrificial gate structure 18 and the dielectric spacer material layer 20. The remaining portion of the fin structure that is presented beneath the sacrificial gate structure 18 and the dielectric spacer material layer 20 can be referred to as a nanosheet stack.

Nanosheet stack includes alternating nanosheets of remaining portions of each sacrificial semiconductor material layer (referred to herein as sacrificial semiconductor material nanosheet 14NS) and remaining portions of each semiconductor channel material layer (referred to herein as semiconductor channel material nanosheet 16NS).

Each nanosheet, i.e., sacrificial semiconductor material nanosheet 14NS and semiconductor channel material nanosheet 16NS, that constitutes the nanosheet stack has a thickness as mentioned above for the individual sacrificial semiconductor material layers 14 and semiconductor channel material layers 16 of the fin structure, and a width from 30 nm to 200 nm. At this point of the present application and as illustrated in FIG. 4, the sidewalls of each sacrificial semiconductor material nanosheet 14NS are vertically aligned to sidewalls of each semiconductor channel material nanosheet 16NS, and the vertically aligned sidewalls of the nanosheet stack are vertically aligned to an outmost sidewall of the dielectric spacer material layer 20.

Figure 5:
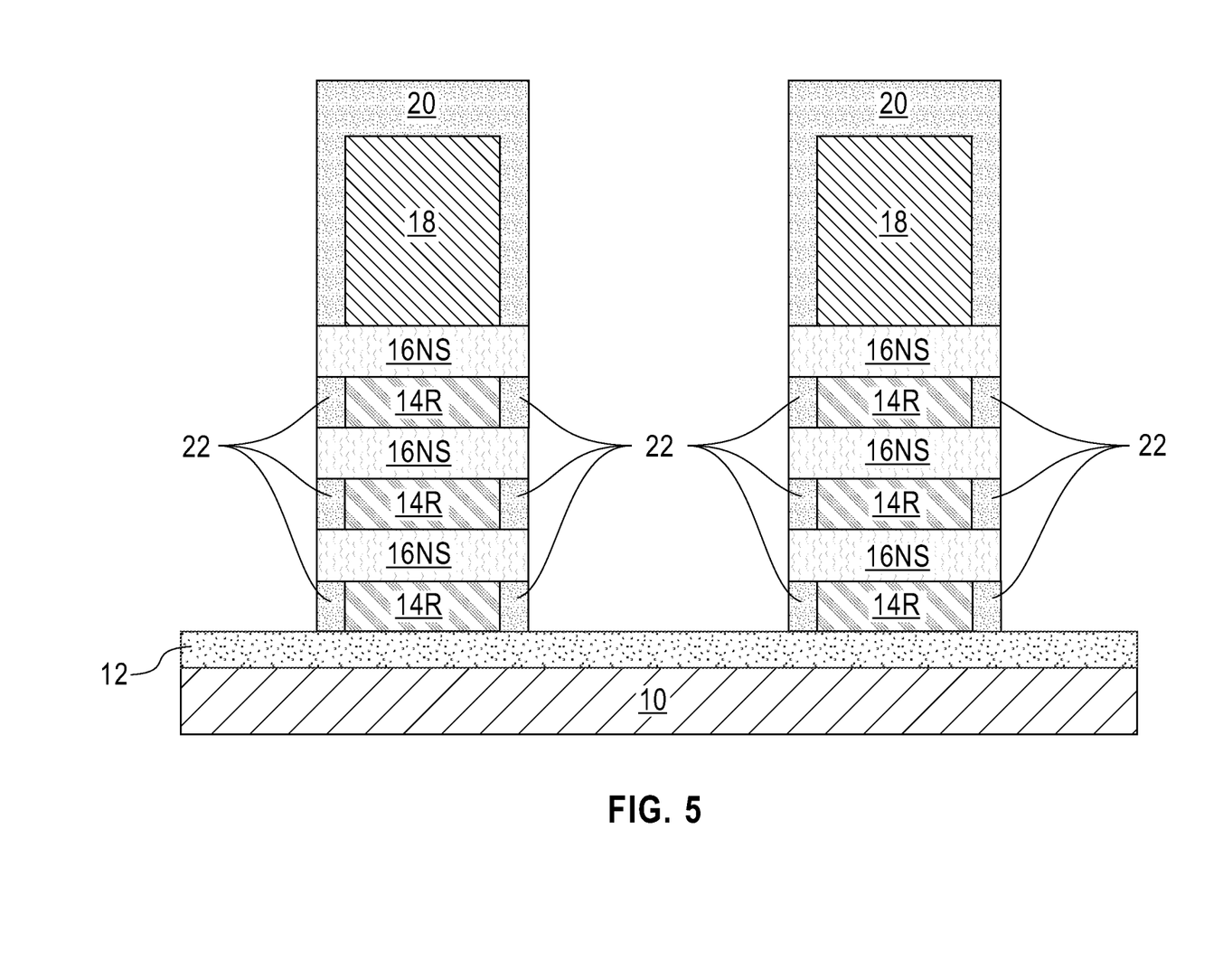
FIG. 5 is a cross sectional view of the exemplary semiconductor structure of FIG. 4 after recessing each sacrificial semiconductor material nanosheet and forming an inner dielectric spacer on exposed sidewalls of each recessed sacrificial semiconductor material nanosheet.

Referring now to FIG. 5, there is illustrated the exemplary semiconductor structure of FIG. 4 after recessing each sacrificial semiconductor material nanosheet 14NS to provide recessed sacrificial semiconductor material nanosheets 14R and forming an inner dielectric spacer 22 on exposed sidewalls of each recessed sacrificial semiconductor material nanosheet 14R.

Each recessed sacrificial semiconductor material nanosheet 14R has a width that is less than the original width of each sacrificial semiconductor material nanosheet 14NS. The recessing of each sacrificial semiconductor material nanosheet 14NS provides a gap (not specifically shown) between each neighboring pair of semiconductor channel material nanosheets 16NS within a given nanosheet stack. The recessing of each sacrificial semiconductor material nanosheet 14NS may be performed utilizing a lateral etching process that is selective in removing physically exposed end portions of each sacrificial semiconductor material nanosheet 14NS relative to each semiconductor channel material nanosheet 16NS.

The inner dielectric spacer 22 is then formed within the gaps by depositing an inner dielectric spacer material and etching the deposited inner dielectric spacer material. In one example, the inner dielectric spacer material is composed of silicon nitride. As is shown, the inner dielectric spacer 22 that is formed in the gaps between each neighboring pair of vertically stacked semiconductor channel material nanosheets 16NS directly contacts a sidewall of one of the recessed sacrificial semiconductor material nanosheets 14R. The inner dielectric spacer 22 that is formed in the gap between each neighboring pair of vertically stacked semiconductor channel material nanosheets 16NS has an outermost sidewall that is vertically aligned to the outermost sidewall of each semiconductor channel material nanosheet 16NS.

Figure 6:
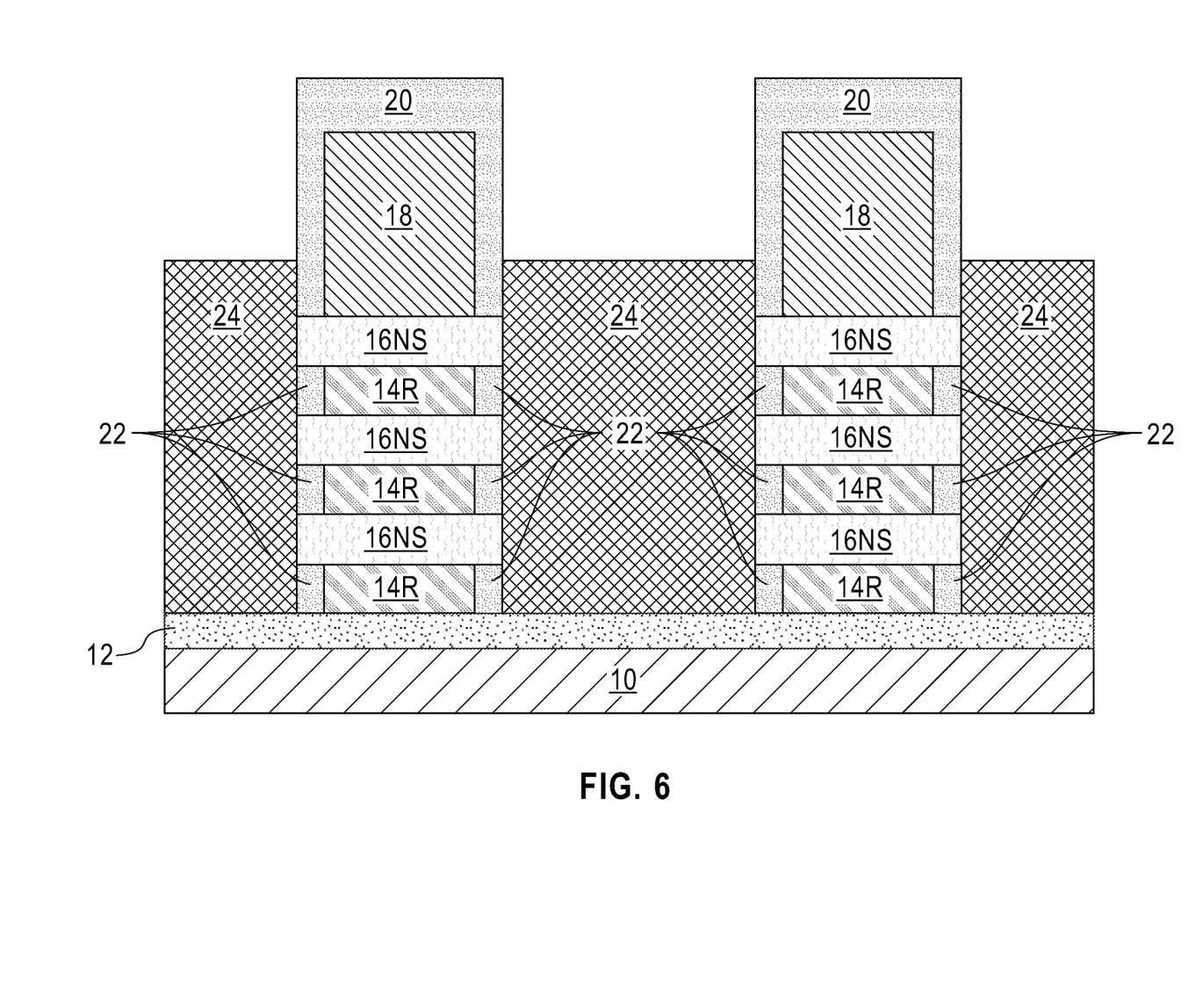
FIG. 6 is a cross sectional view of the exemplary semiconductor structure of FIG. 5 after forming source/drain (S/D) regions by epitaxial growth of a semiconductor material on physically exposed sidewalls of each semiconductor channel material nanosheet.

Referring now to FIG. 6, there is illustrated the exemplary semiconductor structure of FIG. 5 after forming source/drain (S/D) regions 24 by epitaxial growth of a semiconductor material on physically exposed sidewalls of each semiconductor channel material nanosheet 16NS.

Each S/D region 24 includes a semiconductor material and a dopant. The semiconductor material that provides each S/D region 24 can be selected from any semiconductor material that has semiconducting properties. In some embodiments of the present application, the semiconductor material that provides each S/D region 24 may comprise a same semiconductor material as that which provides the semiconductor channel material layer 16 (and thus each semiconductor channel material nanosheet 16NS). In other embodiments of the present application, the semiconductor material that provides each S/D region 24 may comprise a different semiconductor material than that which provides each semiconductor channel material layer 16 (and thus each semiconductor channel material nanosheet 16NS). For example, the semiconductor material that provides each S/D region 24 may comprise a silicon germanium alloy, while each semiconductor channel material layer 16 (and thus each semiconductor channel material nanosheet 16NS) may be composed of silicon.

The dopant that is present in each S/D region 24 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each S/D region 24 can be introduced into the precursor gas that provides each S/D region 24. In another embodiment, the dopant can be introduced into an intrinsic semiconductor layer by utilizing one of ion implantation or gas phase doping. In one example, each S/D region 24 comprises a silicon germanium alloy that is doped with a p-type dopant such as, for example, boron. The dopant concentration in each S/D region 24 is typically from $5 \times 10^{20}$ atoms/cm$^3$ to $5 \times 10^{21}$ atoms/cm$^3$. As mentioned above, each S/D region 24 is formed by an epitaxial growth (or deposition) process, as is defined above. In some embodiments, each S/D region 24 has a faceted upper surface.

Figure 7:
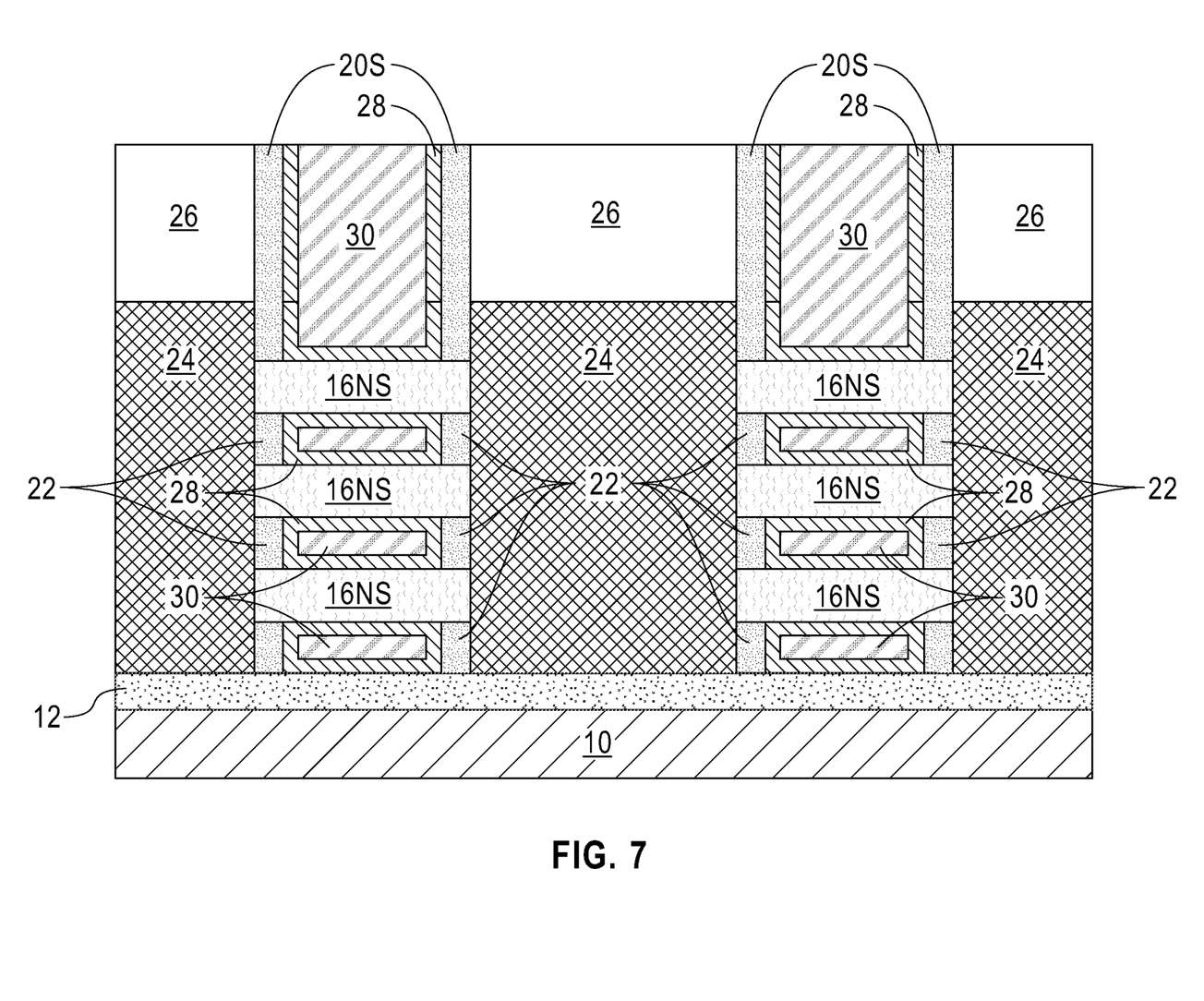
FIG. 7 is a cross sectional view of the exemplary semiconductor structure of FIG. 6 after formation of an interlevel dielectric (ILD) material, removing each sacrificial gate structure and each recessed sacrificial semiconductor material nanosheet, and forming a functional gate structure wrapping around a physically exposed surface of each semiconductor channel material nanosheet.

Referring now to FIG. 7, there is illustrated the exemplary semiconductor structure of FIG. 6 after formation of an interlevel dielectric (ILD) material 26, removing each sacrificial gate structure 18 and each recessed sacrificial semiconductor material nanosheet 14R to suspend the semiconductor channel material nanosheets 16NS, and forming a functional gate structure wrapping around a physically exposed surface of each semiconductor channel material nanosheet.

ILD material 26 is formed atop the S/D regions 24 and laterally surrounding each sacrificial gate structure 18. The ILD material 26 may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as ILD material 26. The use of a self-planarizing dielectric material as the ILD material 26 may avoid the need to perform a subsequent planarizing step.

In one embodiment, the ILD material 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the ILD material 26, a planarization process or an etch back process follows the deposition of the dielectric material that provides the ILD material 26. In some embodiments of the present application and during the planarization or etch back of the ILD material 26, the dielectric spacer material layer 20 that is located above the sacrificial gate structure 18 can be removed providing dielectric spacers 20S. In other embodiments in which a self-planarizing dielectric material is used as the ILD material, the dielectric spacer material layer 20 that is located above the sacrificial gate structure 18 can be removed utilizing a chemical removal process such as, for example, planarization or etching.

Each sacrificial gate structure 18 is then removed utilizing one or more etching steps to provide an upper gate cavity that is located between the dielectric spacers 20S. Each recessed sacrificial semiconductor material nanosheet 14R is then removed utilizing an etching process so as to suspend each of the semiconductor channel material nanosheets 16NS within a given nanosheet stack.

A functional gate structure (28, 30) is then formed surrounding physically exposed surfaces of each semiconductor channel material nanosheet 16NS and within the upper gate cavity. By "functional gate structure" it is meant a permanent gate structure used to control output current (i.e., flow of carriers in the channel) of a semiconducting device through electrical or magnetic fields. The functional gate structure (28, 30) may include a gate dielectric material 28 and a gate conductor material 30. The gate dielectric material 28 may include a dielectric oxide, a dielectric nitride, and/or a dielectric oxynitride. In one example, the gate dielectric material 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric material 28.

The gate dielectric material 28 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 28 can have a thickness in a range from 1 nm to 10 nm. Other thicknesses that are lesser than, or greater than, the aforementioned thickness range can also be employed for the gate dielectric material 28.

The gate conductor material 30 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor material 30 may comprise an nFET gate metal. In another embodiment, the gate conductor material 30 may comprise a pFET gate metal.

The gate conductor material 30 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material 30 can have a thickness from 50 nm to 200 nm. Other thicknesses that are lesser than, or greater than, the aforementioned thickness range can also be employed for the gate conductor material 30.

The functional gate structure can be formed by providing a gate material stack of the gate dielectric material 28, and the gate conductor material 30. A planarization process may follow the formation of the functional gate material stack.

Figure 8:
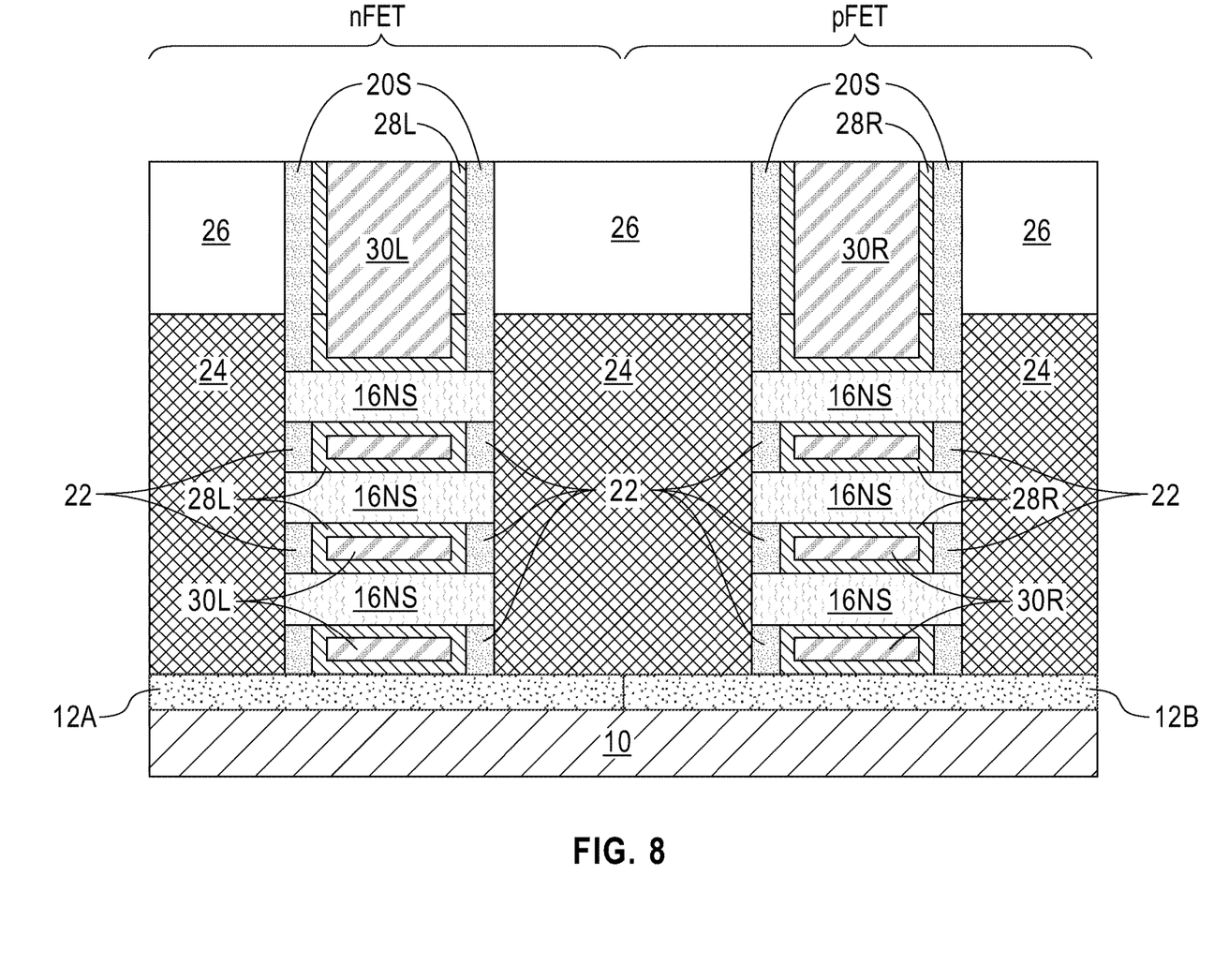
FIG. 8 is a cross sectional view of another exemplary semiconductor structure of the present application including an nFET device region and a pFET device region that can be prepared utilizing the basic processing steps of the present application.

Referring now to FIG. 8, there is illustrated another exemplary semiconductor structure of the present application including an nFET device region and a pFET device region that can be prepared utilizing the basic processing steps of the present application. In this exemplary structure a first isolation layer 12A and a first functional gate structure (28L, 30L) are present in the nFET device region, while a second isolation layer 12B and a second functional gate structure (28R, 30R) are present in the pFET device region. In accordance with the present application, the first isolation layer 12A is composed of a second semiconductor material having a second bandgap that is larger than the first bandgap, wherein the second semiconductor material is lattice matched to the first semiconductor material and contains a p-type dopant, while the second isolation layer 12B is composed of another second semiconductor material having a second bandgap that is larger than the first bandgap, wherein the another second semiconductor material is lattice matched to the first semiconductor material and contains an n-type dopant. In one example, isolation layer 12A is composed of GaP doped with zinc, and second isolation layer 12B is composed of GaP doped with Sn. The first and second functional gate structures may include the same, or different gate dielectric materials (28L, 28R) and/or gate conductor materials (30L, 30R). The first and second isolation layers 12A, 12B can be formed, in any order on, the substrate 10 using block mask technology and epitaxial growth of the different isolation layers.

In the exemplary structures shown in FIGS. 7 and 8, the isolation layer eliminates the parasitic leakage path between the source region and the drain region that typically occurs through the substrate. The isolation layer does not interfere with the functional gate structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:

forming a nanosheet stack of alternating nanosheets of a sacrificial semiconductor material nanosheet and a semiconductor channel material nanosheet on an isolation layer that is disposed on a substrate, wherein a sacrificial gate structure and a dielectric spacer material layer straddle over the nanosheet stack, and wherein the substrate is composed of a first semiconductor material having a first bandgap, and the isolation layer is composed of a second semiconductor material having a second bandgap that is larger than the first bandgap, and further wherein the second semiconductor material is lattice matched to the first semiconductor material and is doped such that the second semiconductor material has semi-insulating properties, and wherein the second semiconductor material is composed of GaP doped with one of chromium, zinc and tin or InP doped with iron;

recessing end portions of each of the sacrificial semiconductor material nanosheets to provide a gap between each of the semiconductor channel material nanosheets;

forming an inner spacer in each gap;

forming a source/drain (S/D) region by epitaxial growth of a semiconductor material on physically exposed sidewalls of each semiconductor channel material nanosheet, wherein the S/D region has a bottommost surface that directly contacts a surface of the isolation layer;

removing the sacrificial gate structure and each recessed sacrificial semiconductor material nanosheet and exposing surfaces of each semiconductor channel material nanosheet; and forming a functional gate structure around the exposed surfaces of each semiconductor channel material nanosheet.

2. The method of claim 1, wherein the first semiconductor material is composed of Si, and the second semiconductor material is composed of GaP doped with chromium.

3. The method of claim 2, wherein the chromium is present an amount from 1E15 atoms/cm$^3$ to 1E18 atoms/cm$^3$.

4. The method of claim 2, wherein each of the semiconductor channel material nanosheets is composed of silicon, and each of the sacrificial semiconductor material nanosheets is composed of a silicon germanium alloy.

5. The method of claim 1, wherein the first semiconductor material is composed of Si, and the second semiconductor material is composed of GaP doped with zinc or GaP doped with tin.

6. The method of claim 5, wherein the tin is present an amount from 1E17 atoms/cm$^3$ to 1E20 atoms/cm$^3$.

7. The method of claim 5, wherein each of the semiconductor channel material nanosheets is composed of silicon, and each of the sacrificial semiconductor material nanosheets is composed of a silicon germanium alloy.

8. The method of claim 1, wherein first semiconductor material is composed of InGaAs, and the second semiconductor material is composed of InP doped with iron.

9. The method of claim 1, wherein the isolation layer is formed by epitaxial growth on a surface of the substrate.

10. The method of claim 1, wherein the forming of the nanosheet stack comprises:

forming a fin structure comprising a vertical stack of alternating layers of a sacrificial semiconductor material and a semiconductor channel material on the isolation layer;

forming the sacrificial gate structure on a portion of the fin structure;

forming the dielectric spacer material layer laterally adjacent to the fin structure and on another portion of the fin structure; and removing physically exposed portions of the fin structure not covered by the sacrificial gate structure and the dielectric spacer material layer.

11. The method of claim 10, wherein the forming of the fin structure comprises:

epitaxial growing a semiconductor material stack containing the alternating layers of the sacrificial semiconductor material and the semiconductor channel material; and patterning the semiconductor material stack.

12. The method of claim 1, wherein the recessing comprises a lateral etching process.

13. The method of claim 1, further comprising forming, prior to removing the sacrificial gate structure, an interlevel dielectric material layer on each S/D region and laterally surrounding the sacrificial gate structure.

14. The method of claim 1, wherein the functional gate structure comprises a gate dielectric material and a gate conductor material, wherein the gate dielectric material is U-shape and has a topmost surface that is coplanar with a topmost surface of the gate conductor material.

15. The method of claim 1, wherein each recessed sacrificial semiconductor material nanosheet has a length that is less than a length of each semiconductor channel material nanosheet.

16. The method of claim 1, wherein the forming the inner spacer comprises depositing an inner dielectric spacer material and etching the deposited inner dielectric spacer material.

17. The method of claim 1, wherein the dielectric spacer material layer extends onto a topmost surface of the sacrificial gate structure, and the dielectric spacer material layer that extends onto the topmost surface of the sacrificial gate structure is removed prior to removing the sacrificial gate structure.

18. The method of claim 1, wherein the inner spacer has an outermost sidewall that is vertically aligned to an outermost sidewall of each semiconductor channel material nanosheet.

* * * * *